United States Patent
Nagakura et al.

(10) Patent No.: US 7,189,659 B2
(45) Date of Patent: Mar. 13, 2007

(54) METHOD FOR FABRICATING A SEMICONDUCTOR DEVICE

(75) Inventors: Yoshimasa Nagakura, Fukushima (JP); Hideaki Ohashi, Aichi (JP)

(73) Assignees: Fujitsu Limited, Kawasaki (JP); Spansion LLC, Sunnyvale, CA (US)

( * ) Notice: Subject to any disclaimer, the term of this patent is extended or adjusted under 35 U.S.C. 154(b) by 164 days.

(21) Appl. No.: 10/705,881

(22) Filed: Nov. 13, 2003

(65) Prior Publication Data

US 2004/0097098 A1 May 20, 2004

(30) Foreign Application Priority Data

Nov. 15, 2002 (JP) ............................. 2002-331694

(51) Int. Cl.
*H01L 21/31* (2006.01)

(52) U.S. Cl. ...................... 438/760; 438/784; 438/795

(58) Field of Classification Search ................ 438/760, 438/784, 795
See application file for complete search history.

(56) References Cited

U.S. PATENT DOCUMENTS 6,149,974 A * 11/2000 Nguyen et al. ........ 427/255.29
6,319,324 B1 * 11/2001 Nguyen et al. ............. 118/697
6,905,956 B2 * 6/2005 Hill ............................ 438/624
2004/0097098 A1 * 5/2004 Nagakura et al. ........... 438/760

FOREIGN PATENT DOCUMENTS

| JP | 6-140572 | 5/1994 |
| JP | 7-111253 | 4/1995 |
| JP | 2001-244264 | 9/2001 |
| JP | 2001-338976 | 12/2001 |
| JP | 2001338976 A * | 12/2001 |

* cited by examiner

*Primary Examiner*—Laura M. Schillinger
(74) *Attorney, Agent, or Firm*—Westerman, Hattori, Daniels & Adrian, LLP.

(57) ABSTRACT

A method for fabricating a semiconductor device comprises the step of depositing an insulation film 32a with a first pressure set in a deposition chamber; the step of gradually decreasing the pressure in the deposition chamber to a second pressure which is lower than the first pressure; and the step of further depositing the insulation film 32b with the second pressure set in the deposition chamber. The insulation film is deposited with the first pressure a little lower than a second pressure set in a deposition chamber, and the insulation film is further deposited with the second pressure lower than the first pressure set in the deposition chamber. Furthermore, the insulation film is not deposited in the state where the pressure in the deposition chamber is extremely low, and an atmosphere in the deposition chamber is unstable. Thus, a semiconductor device having the insulation film with a sufficiently flat surface can be fabricating without using reflow process.

11 Claims, 15 Drawing Sheets

METHOD FOR FABRICATING A SEMICONDUCTOR DEVICE

CROSS-REFERENCE TO RELATED APPLICATION

This application is based upon and claims priority of Japanese Patent Application No. 2002-331694, filed on Nov. 15, 2002, the contents being incorporated herein by reference.

BACKGROUND OF THE INVENTION

The present invention relates to a method for fabricating a semiconductor device, more specifically a method for fabricating a semiconductor device having an insulation film.

In a conventional method for fabricating a semiconductor device, an inter-layer insulation film is formed by, e.g., BPSG on a semiconductor substrate with a gate electrode, an interconnection layer, etc. formed on, and then the surface of the inter-layer insulation film is planarized by long-time and high-temperature reflow process.

On the other hand, recently the technique of forming a metal silicide layer on the surface of the source/drain-diffused layer of a transistor is noted. Cobalt silicide is noted as the metal silicide. This technique can decrease the contact resistance of the source/drain.

However, it is not desirable to make the surface of the inter-layer insulation film planarized by the reflow process in forming a metal silicide layer on the surface of the source/drain diffused layer. The reflow process for planarizing the surface of the inter-layer insulation film is performed at high temperatures as high as 800–1000° C. and furthermore for a long period of time, which makes the silicidation excessive. The excessive silicidation is a cause for a short, etc.

Then, a technique that the inter-layer insulation film deposited in a state where a pressure in a deposition chamber is set to be a little lower than the atmospheric pressure, i.e., to be the sub-atmospheric pressure, and then the inter-layer insulation film is further deposited in a state where a pressure in the deposition chamber is set low is proposed (refer to Patent Reference 1).

In depositing the inter-layer insulation film in a state where a pressure in the deposition chamber is set to be a first pressure which is a little lower than the atmospheric pressure, the inter-layer insulation film is deposited at a relatively low film deposition rate but can be buried without failure in-between the gate electrode, etc. The inter-layer insulation film can be deposited at a high film deposition rate in depositing the inter-layer insulation film in a state where a pressure in the deposition chamber is set to be a second pressure which is lower. The proposed method for fabricating a semiconductor device can form the inter-layer insulation film which is to some extent flat without using the reflow.

Following references disclose the background art of the present invention.

[Patent Reference 1]
Specification of Japanese Patent Application Unexamined Publication No. 2001-338976

[Patent Reference 2]
Specification of Japanese Patent Application Unexamined Publication No. Hei 6-140572

[Patent Reference 3]
Specification of Japanese Patent Application Unexamined Publication No. Hei 7-111253

[Patent Reference 4]
Specification of Japanese Patent Application Unexamined Publication No. 2001-244264

However, the proposed method for fabricating the semiconductor device cannot obtain the inter-layer insulation film with a sufficiently flat surface.

SUMMARY OF THE INVENTION

An object of the present invention is to provide a method for fabricating a semiconductor device, which can form an insulation film with a sufficiently flat surface without performing the reflow process.

According to one aspect of the present invention, there is provided a method for fabricating a semiconductor device comprising: the step of depositing an insulation film with a first pressure set in a deposition chamber; the pressure adjusting step of decreasing a pressure in the deposition chamber from a first pressure to a second pressure which is lower than the first pressure; and the step of further depositing the insulation film with the second pressure set in the deposition chamber.

According to another aspect of the present invention, there is provided a method for fabricating a semiconductor device comprising: the step of depositing an insulation film with a first pressure set in a deposition chamber; the step of exhausting an atmosphere in the deposition chamber so as to gradually decrease the pressure in the deposition chamber while an atmosphere in the deposition chamber is being replaced by an inert atmosphere; the pressure adjusting step of setting a second pressure lower than the first pressure in the deposition chamber; and the step of further depositing the insulation film with the second pressure set in the deposition chamber.

According to further another aspect of the present invention, there is provided a method for fabricating a semiconductor device comprising: the step of depositing an insulation film with a first pressure set in a deposition chamber; the step of replacing the atmosphere in the deposition chamber by an inert atmosphere; the step of exhausting the atmosphere in the deposition chamber; the pressure adjusting step of setting a second pressure lower than the first pressure in the deposition chamber; and the step of further depositing the insulation film with the second pressure set in the deposition chamber.

According to further another aspect of the present invention, there is provided a method for fabricating a semiconductor device comprising: the step of depositing an insulation film with a first pressure set in a deposition chamber; the step of exhausting an atmosphere in the deposition chamber while the atmosphere in the deposition chamber is being replaced by an inert atmosphere; the pressure adjusting step of setting a second pressure lower than the first pressure in the deposition chamber; and the step of further depositing the insulation film with the second pressure set in the deposition chamber.

According to the present invention, an insulation film is deposited with a first pressure a little lower than the atmospheric pressure set in a deposition chamber, and the insulation film is further deposited with the second pressure lower than the first pressure set in the deposition chamber. Furthermore, according to the present invention, the insulation film is not deposited in the state where the pressure in the deposition chamber is extremely low, and an atmosphere in the deposition chamber is unstable. Thus, according to the present invention, a semiconductor device having the insulation film with a sufficiently flat surface can be fabricated without using reflow process.

DETAILED DESCRIPTION OF THE INVENTION

The inventors of the present invention have made the following earnest studies of causes for the proposed method for fabricating the semiconductor device being unable to form an insulation film with a sufficiently flat surface.

Figure 13:
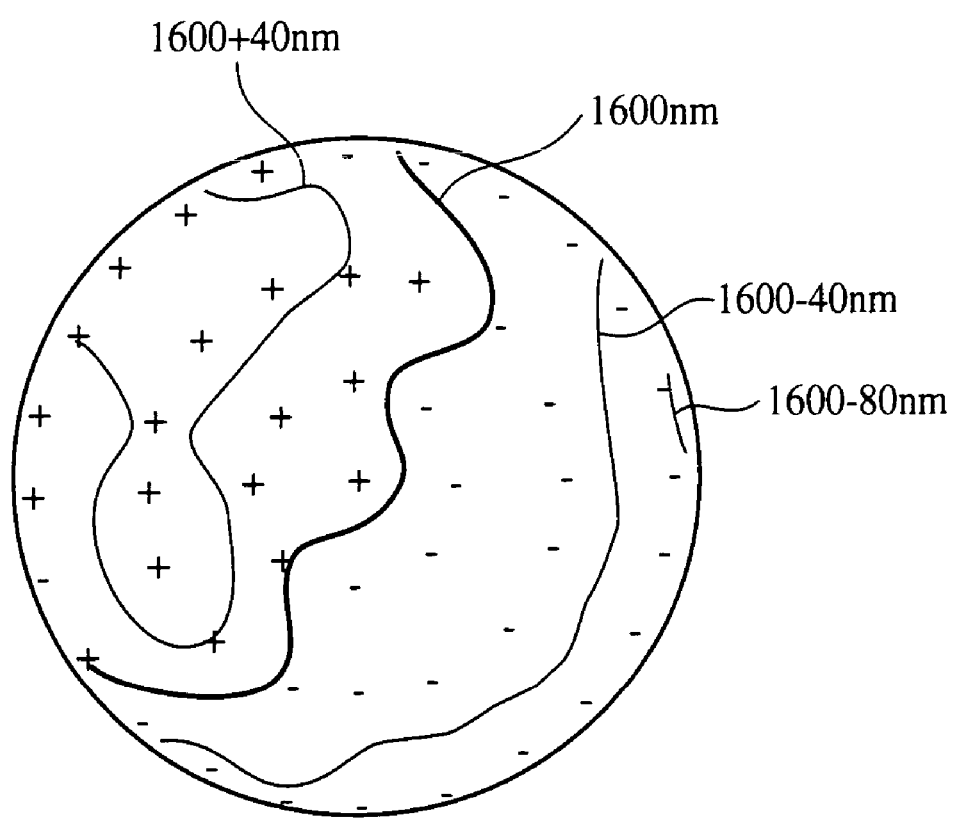
FIG. 13 is a plan view of an intra-plane distribution of the film thickness of the inter-layer insulation films (Part 2).

FIG. 13 is a plan view of an intra-plane distribution of the film thickness of the inter-layer insulation film formed by the proposed method for fabricating the semiconductor device. FIG. 13 is the upper side view of the semiconductor wafer. In FIG. 13, the film thicknesses are indicated by contours. The thick line in FIG. 13 indicates the parts of a 1600 nm-film thickness. The film deposition apparatus was a SACVD (Sub-Atmospheric Chemical Vapor Deposition) apparatus. The "+" marks in FIG. 13 indicates the part where the inter-layer insulation film is thicker than 1600 nm. The "−" marks in FIG. 13 indicate the part where the inter-layer insulation film is thinner than 1600 nm.

As seen in FIG. 13, the inter-layer insulation film formed by the proposed method for fabricating the semiconductor device is thicker on one side of the semiconductor wafer and thinner on the other side of the semiconductor wafer.

Figure 14:
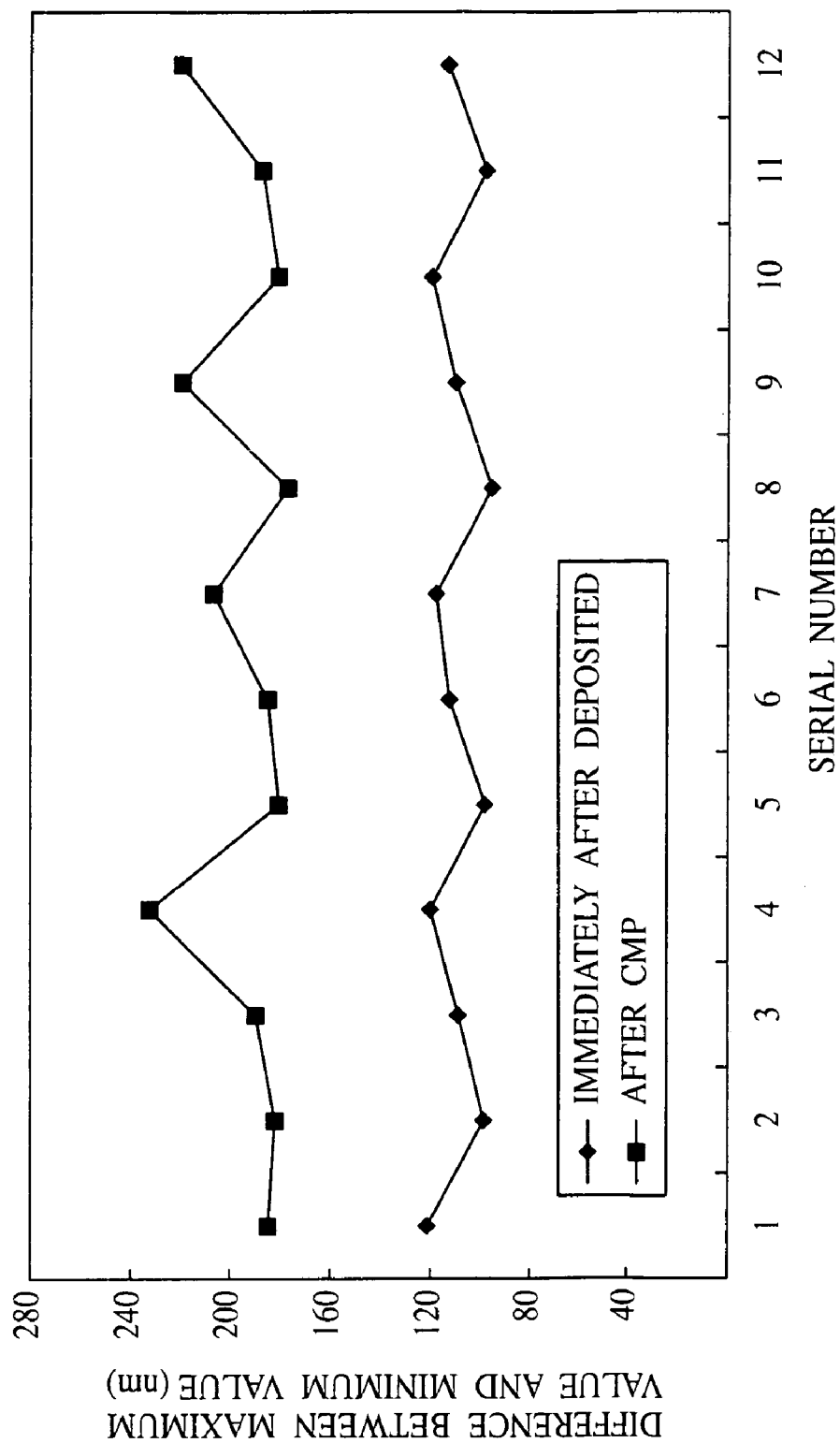
FIG. 14 is a graph of differences between maximum values and minimum values of the film thicknesses of the inter-layer insulation films (Part 2).

FIG. 14 is a graph of differences between maximum values and minimum values of the film thickness of the inter-layer insulation films formed by the proposed method for fabricating the semiconductor device. Serial numbers of the semiconductor wafers are taken on the horizontal axis. Differences of the maximum values and the minimum values are taken on the vertical axis. The "♦" marks indicate differences between the maximum values and the minimum values of the inter-layer insulation films immediately after formed. The "■" marks indicate differences between the maximum values and the minimum values of the inter-layer insulation films after having the surfaces polished by CMP.

As indicated by the "♦" marks in FIG. 14, the differences between the maximum values and the minimum values of the film thickness of the inter-layer insulation films immediately after formed are relatively large.

Also as shown by the "■" marks in FIG. 14, the differences between the maximum values and the minimum values of the inter-layer insulation films as having the surfaces polished by CMP are strikingly increased. It is considered that the differences between the maximum values and the minimum values of the film thickness of the inter-layer insulation films are strikingly increased by having the surfaces of the inter-layer insulation films polished by CMP because of the intra-plane distribution of the film thickness of the intra-layer insulation film shown in FIG. 13. That is, because the inter-layer insulation film is thicker on one side of the semiconductor wafer and thinner on the other side of the semiconductor wafer, polishing the surface of the inter-layer insulation film by CMP will strikingly increase the differences of the film thickness of the inter-layer insulation film between the maximum value and the minimum value because of the characteristics of the CMP apparatuses.

Figure 15:
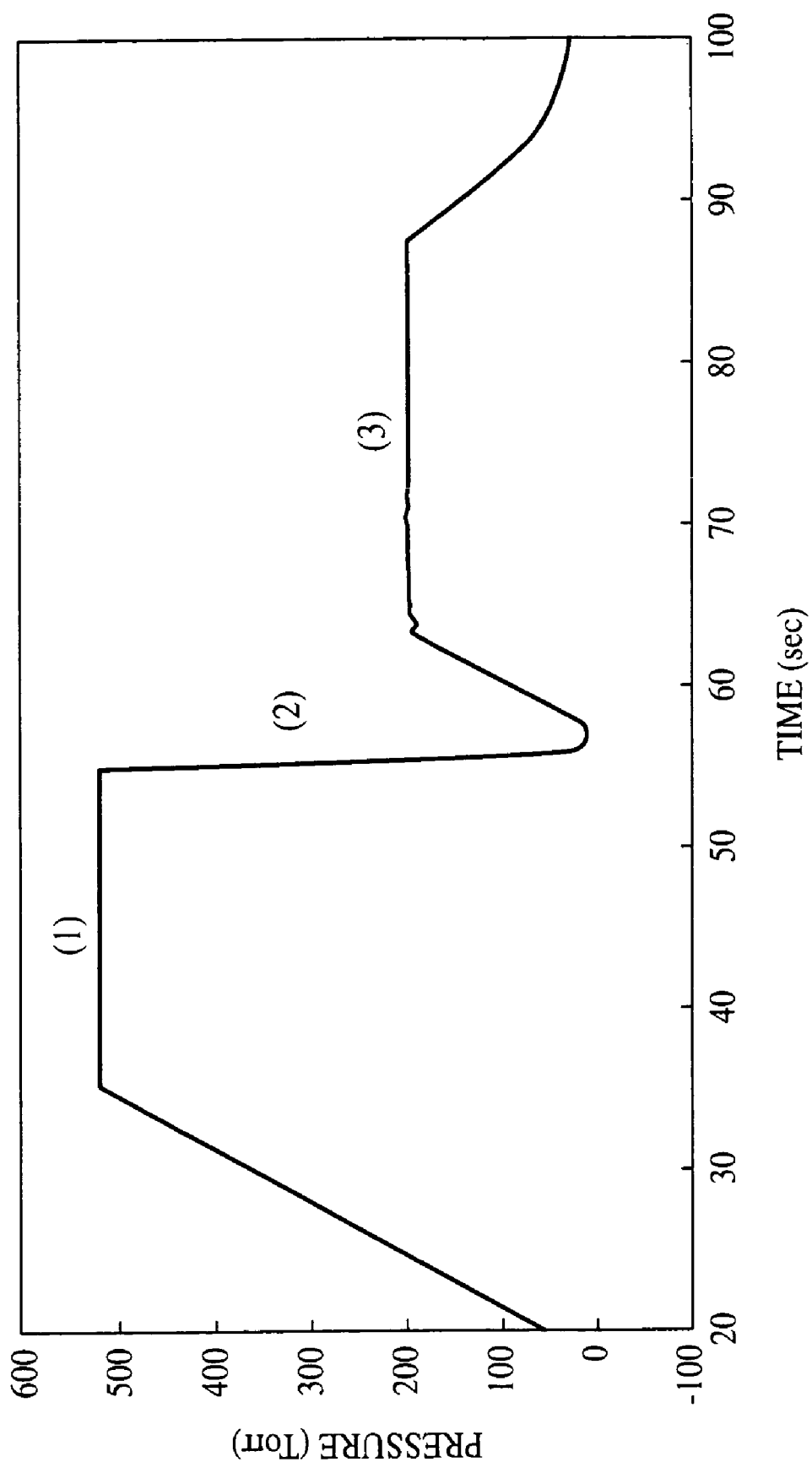
FIG. 15 is a time chart of measurement results of pressures in the deposition chamber (Part 2).

FIG. 15 is the time chart of a measurement result of pressures in the deposition chamber in which the inter-layer insulation film was formed by the proposed method for fabricating the semiconductor device.

In the proposed method for fabricating the semiconductor device, the inter-layer insulation film is formed in a state where a pressure in the deposition chamber is set to be a first pressure which is a little lower than the atmospheric pressure (see (1) of FIG. 15), the atmosphere in the deposition chamber is exhausted to set the pressure inside the deposition chamber to be a second pressure which is relatively low (see (2) of FIG. 15), and the inter-layer insulation film is further deposited in a state where a pressure in the deposition chamber is set to be a second pressure (see (3) of FIG. 15). As indicated by (2) in FIG. 15, the pressure in the deposition chamber is extremely lowered when the pressure in the deposition chamber is changed to the second pressure.

In the proposed method for fabricating the semiconductor device, it is considered that the difference between the maximum value and the minimum value of the inter-layer insulation film is large, and the intra-plane distribution of the film thickness of the inter-layer insulation film is as shown in FIG. 13, because a pressure in the deposition chamber is extremely lowered when a first pressure in the deposition chamber is changed to a second pressure, and furthermore, the inter-layer insulation film is deposited disuniformly in a state where the atmosphere is unstable in the deposition chamber. That is, in a case that the pressure inside the deposition chamber is extremely decreased, and additionally, the atmosphere inside the deposition chamber becomes unstable the inter-layer insulation film is deposited in disuniform thickness.

Based on the above-described study results, the inventors of the present invention have got an idea that the inter-layer insulation film is not deposited in a state where a pressure in the deposition chamber is low and an atmosphere in the deposition chamber is unstable, but is deposited in a state where a pressure in the deposition chamber is set at a suitable pressure, whereby the inter-layer insulation film with a sufficiently flat surface can be deposited.

[A First Embodiment]

The method for fabricating the semiconductor device according to a first embodiment of the present invention will be explained with reference to FIGS. 1A to 10. FIGS. 1A to 5B are sectional views of the semiconductor device according to the present embodiment in the steps of the method for fabricating the semiconductor device, which show the method.

Figure 1A:
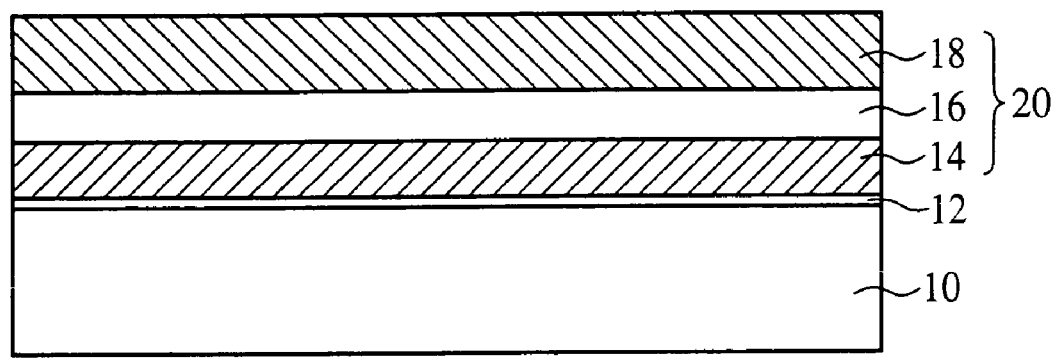
FIGS. 1A and 1B are sectional views of a semiconductor device according to a first embodiment of the present invention in the steps of the method for fabricating the semiconductor device, which show the method (Part 1).

First, as shown in FIG. 1A, a silicon oxide film 12 is formed on the entire surface of a semiconductor substrate 10 of, e.g., silicon by, e.g., thermal oxidation. The silicon oxide film 12 is to be a tunnel insulation film 12 of a transistor of the floating gate structure (see FIG. 1B).

Then, a polysilicon film 14 is formed on the entire surface by, CVD (Chemical Vapor Deposition). The polysilicon film 14 is to be the floating gate 14 of the transistor of the floating gate structure (see FIG. 1B).

Next, a silicon oxide film 16 is formed on the entire surface by, e.g., CVD. The silicon oxide film 16 is to be the dielectric film 16 of the transistor of the floating gate structure (see FIG. 1C).

Then, a polysilicon film 18 is formed on the entire surface by, e.g., CVD. The polysilicon film 18 is to be the control gate electrode 18 of the transistor of the floating gate structure (see FIG. 1B). The layer film 20 of the polysilicon film 14, the silicon oxide film 16 and the polysilicon film 18 is thus formed.

Figure 1B:
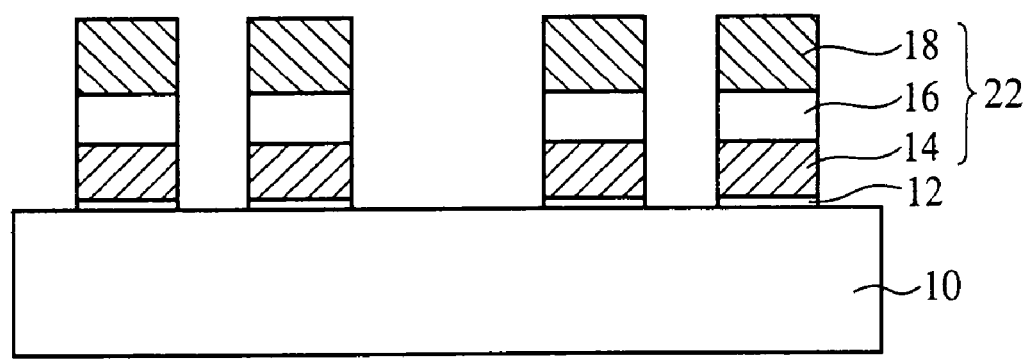

Then, the layer film 20 is patterned as shown in FIG. 1B. The floating gate 22 of the floating gate structure of the floating gate electrode 14, the dielectric film 16 and control gate electrode 18 is thus formed on the tunnel insulation film 12.

Next, a photoresist film (not shown) is formed by, e.g., spin coating. Then; an opening (not shown) reach to a region for a drain diffused layer 26b (see FIG. 2B) to be formed in is formed in the photoresist film by photolithography. Next, a p type dopant is implanted in the semiconductor substrate 10 by, e.g., ion implantation with the photoresist film and the gate electrode 22 as a mask. Thus, a p⁻ type pocket region 24 is formed (see FIG. 2A).

Figure 2A:
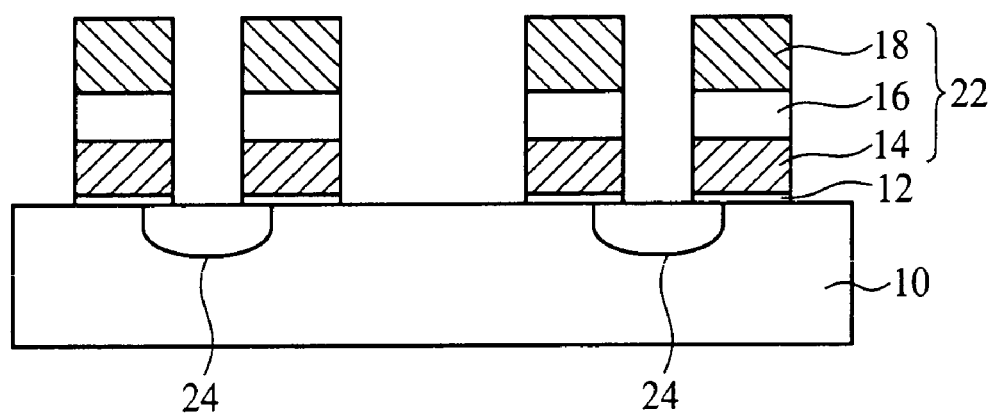
FIGS. 2A and 2B are sectional views of a semiconductor device according to a first embodiment of the present invention in the steps of the method for fabricating the semiconductor device, which show the method (Part 2).
Figure 2B:
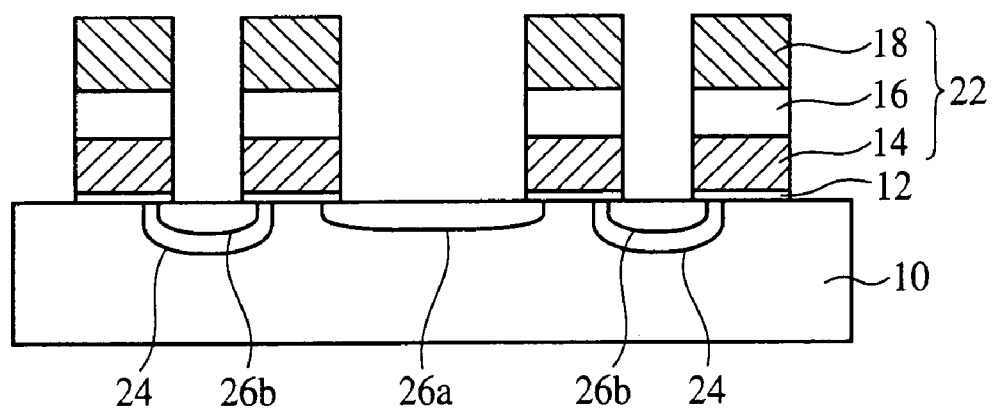

Then, as shown in FIG. 2B, with the gate electrode 22 as a mask, an n type dopant is implanted in the semiconductor substrate 10 by, e.g., ion implantation. Thus, an n⁺ type source diffused layer 26a and the drain diffused layer 26b are formed.

Next, an insulation film of a silicon oxide film or a silicon nitride film is formed on the entire surface by, e.g., CVD. Then, the insulation film is anisotropically etched. Thus, a sidewall insulation film 28 is formed on the side wall of the gate electrode 22 (see FIG. 3A).

Next, with the gate electrode 22 and the sidewall insulation film 28 as a mask, an n type dopant is heavily implanted in the semiconductor substrate 10. Thus, a contact layer 30 is formed.

Then, a metal film of, e.g., Co (cobalt) is formed on the entire surface by, e.g., sputtering. The metal film is formed in a thickness of, e.g., above 5 nm. Next, the Co of the metal film and the Si of the semiconductor substrate 10 are reacted with each other by thermal processing. Thus, a cobalt silicide layer, for example, is formed. Then, the metal film which has not been reacted with the Si is removed. Thus, a metal silicide layer 31 of cobalt silicide is formed.

Figure 6:
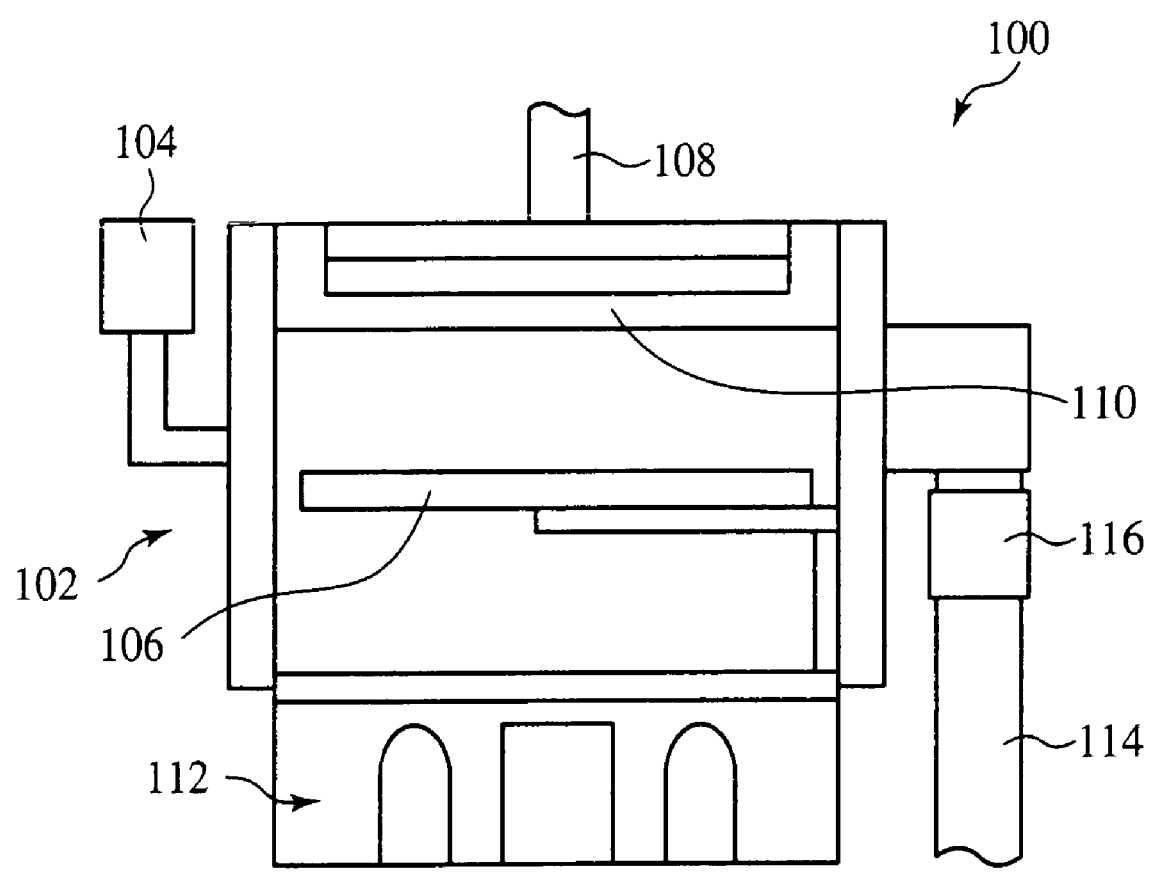
FIG. 6 is diagrammatic view of the film deposition apparatus.

Then, a film deposition apparatus 100 for depositing the inter-layer insulation film is prepared. FIG. 6 is a diagrammatic view of the film deposition apparatus. The film deposition apparatus 100 mainly comprises, a deposition chamber 102, a pressure gauge 104 for metering the pressure in the deposition chamber 102, a susceptor 106 for mounting a semiconductor substrate 10 in the deposition chamber 102, a raw material supply pipe 108 for supplying a raw material into the deposition chamber 102, a shower plate 110 for injecting the raw material into the deposition chamber 102, a lump heater 112 for controlling the temperature in the deposition chamber 102, an exhaust pipe 114 for exhausting an atmosphere in the deposition chamber 102, and a throttle valve 116 for controlling the exhaust amount.

Next, the semiconductor substrate 10 is mounted on the susceptor 106.

Figure 7:
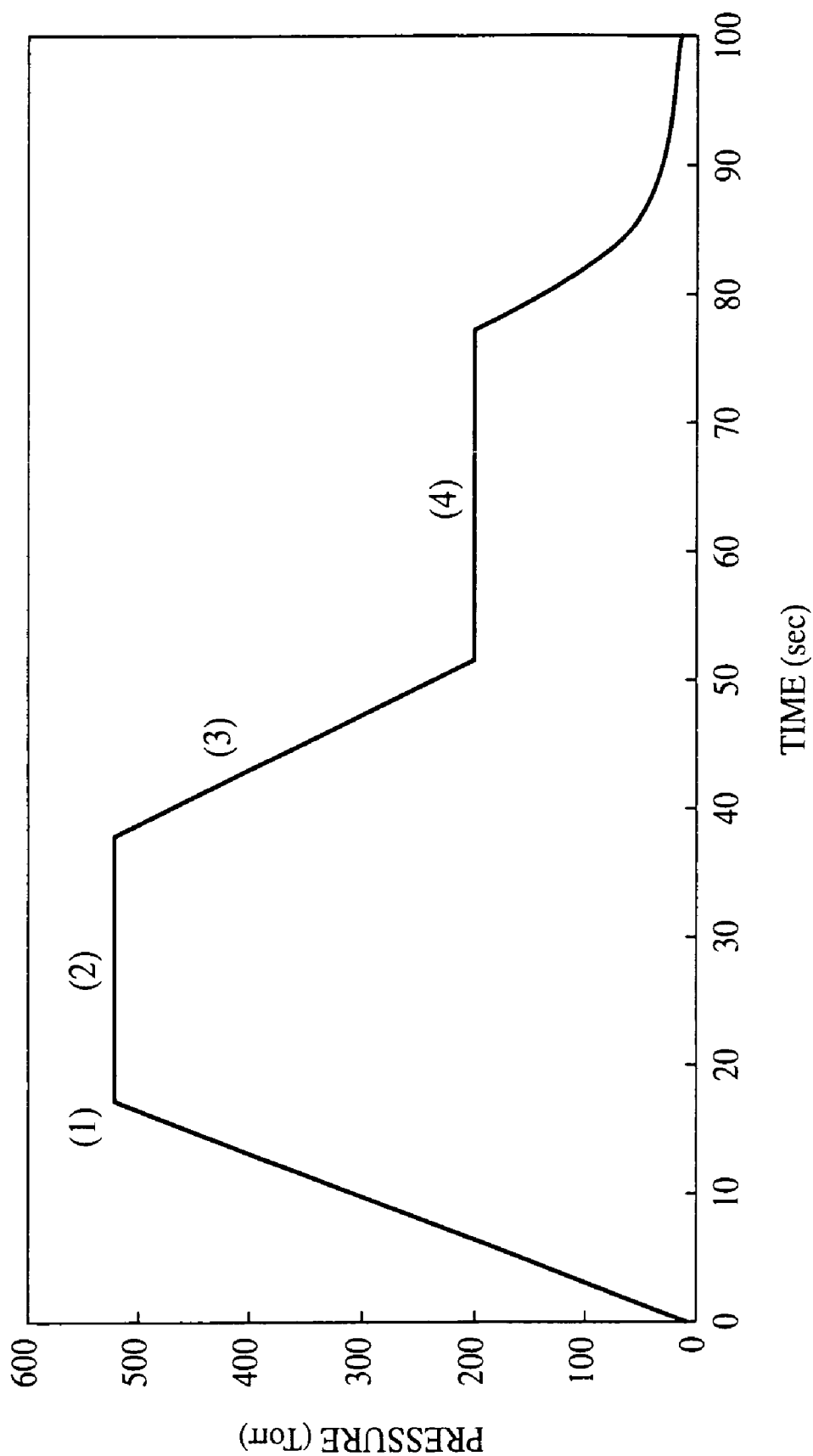
FIG. 7 is a time chart of pressures in the deposition chamber (Part 1).

Then, an inter-layer insulation film 32 of, e.g., BPSG (Bro-Phospho Silicate Glass) on the entire surface by thermal CVD. The inter-layer insulation film 32 is formed in the following way. FIG. 7 is a time chart of the pressure in the deposition chamber when the inter-layer insulation film is formed by the method for fabricating the semiconductor device according to the present embodiment.

First as indicated by (1) in FIG. 7, the pressure in the deposition chamber 102 is set at a relatively high pressure, i.e., the first pressure, which is a little lower than the atmospheric pressure. The first pressure is, e.g., about 600 Torr.

Figure 3A:
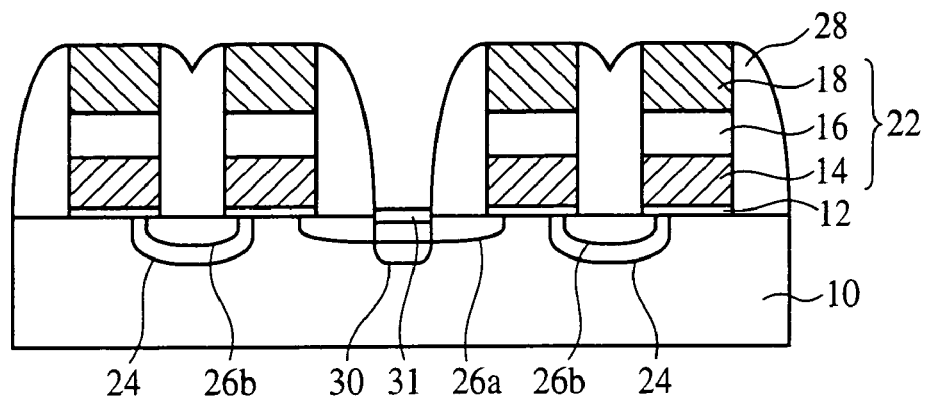
FIGS. 3A and 3B are sectional views of a semiconductor device according to a first embodiment of the present invention in the steps of the method for fabricating the semiconductor device, which show the method (Part 3).
Figure 3B:
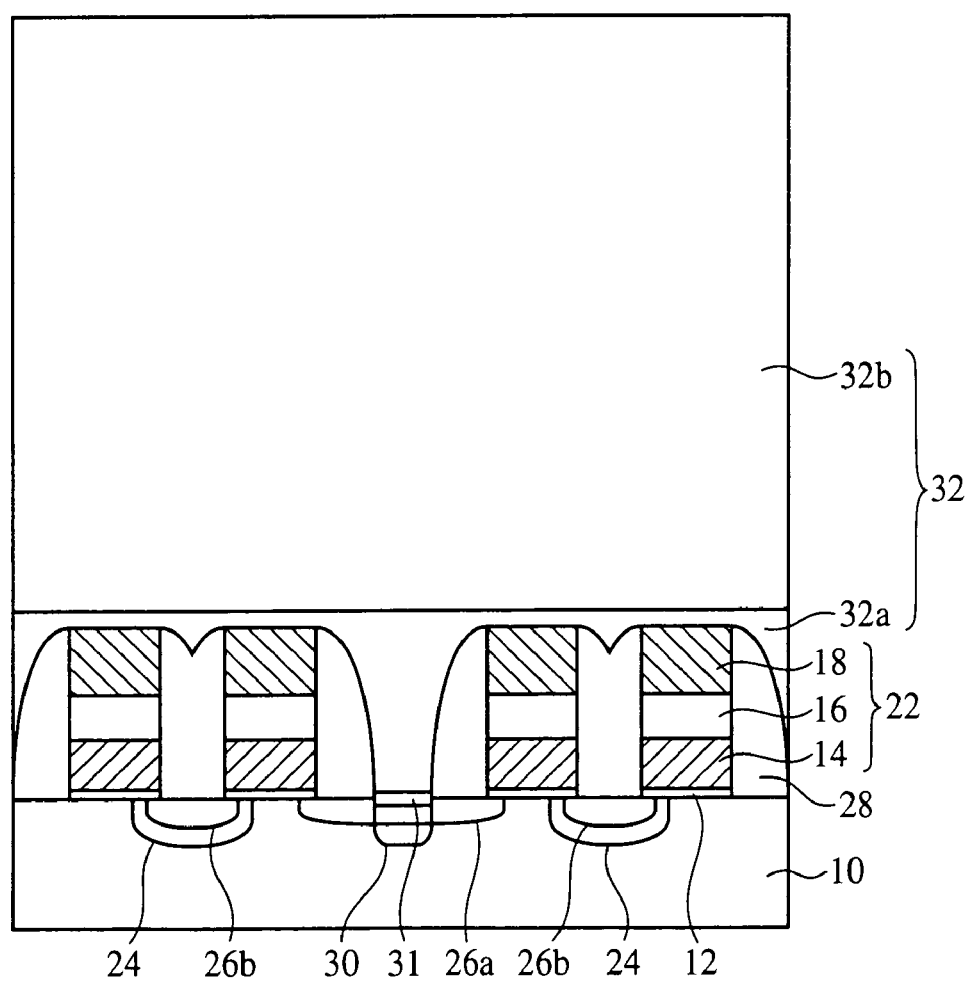

Next, as indicated by (2) in FIG. 7, with the pressure in the deposition chamber 102 set at the first pressure, a raw material gas is introduced into the deposition chamber 102 to form the inter-layer insulation film 32a (see FIG. 3B). At this time, the film thickness of the inter-layer insulation film 32a is, e.g., about 300 nm, and the first pressure is about, e.g., 600 Torr. The inter-layer insulation film 32a is deposited with the pressure in the deposition chamber 102 set at a pressure which is a little lower than the atmospheric pressure so that the inter-layer insulation film 32a is buried between the gate electrodes 22 without failure. The raw material gas is, e.g., TEOS ($Si(OC_2H_5)_4$, ethyl silicate), TEPO ($PO(OCH_3)_3$, trimethyl phosphate), TEB ($B(OC_2H_5)_3$, triethyl borate). The flow rate of the TEOS gas is, e.g., 132–198 mg/min. The flow rate of the TEPO gas is, e.g., 16–24 mg/min. The flow rate of the TEB gas is, e.g., 40–60 mg/min. The deposition time is, e.g., 280–420 seconds. The deposition temperature is, e.g., 460–500° C.

Next, the introduction of the raw material gas into the deposition chamber 102 is stopped.

Then, as indicated by (3) in FIG. 7, an inert gas is introduced into the deposition chamber 102 to replacing the atmosphere in the deposition chamber with the inert gas atmosphere while gradually decreasing the first pressure in the deposition chamber 102 to the second pressure, which is a relatively low pressure. The inert gas is, e.g., He gas, $N_2$ gas or $O_2$ gas. The inert gas is introduced into the deposition chamber 102 when the pressure in the deposition chamber 102 is gradually decreased so that the deposition of the inter-layer insulation film in an unstable atmosphere in the deposition chamber is prevented not to make the film thickness of the inter-layer insulation film disuniform. The second pressure is, e.g., about 200 Torr. When the pressure in the deposition chamber 102 is gradually lowered, the opening of the throttle valve 116 is controlled while pressures in the deposition chamber 102 are metered by a pressure gauge 104, so as to decrease the pressure in the deposition chamber 102. The rate at which the pressure in the deposition chamber 102 is decreased is below, e.g., 40 Torr/sec. The pressure in the deposition chamber 102 is gradually decreased at a rate lower than 40 Torr/sec to thereby prevent the pressure in the deposition chamber 102 from extremely lowering. When the rate of lowering the pressure in the deposition chamber 102 is too low, much time is taken to lower the pressure. Preferably, the rate is, e.g., 5–40 Torr/sec. The pressure in the deposition chamber 102 is gradually lowered to thereby prevent the extreme decrease of the pressure in the deposition chamber 102.

Then, as indicated by (4) in FIG. 7, with the pressure in the deposition chamber 102 set at the second pressure, which is relatively low, the raw material gas is introduced into the deposition chamber 102 to further deposit the inter-layer insulation film 32b. The thickness of the inter-layer insulation film 32b is, e.g., about 1300 nm. The inter-layer insulation film 32b is deposited with the pressure in the deposition chamber 102 set at the second pressure, which is relatively low. This is for the purpose of depositing the inter-layer insulation film 32b at high deposition rate. The second pressure is, e.g., about 200 Torr. Raw material gases are, e.g., TEOS gas, TEPO gas and TEB gas. The flow rate of the TEOS gas is, e.g., 400–600 mg/min. The flow rate of the TEPO gas is, e.g., 32–48 mg/min. The flow rate of the TEB gas is, e.g., 132–198 mg/min. The deposition time is, e.g., 140–210 seconds. The deposition temperature is, e.g., 460–500° C.

Thus, the inter-layer insulation film 32 is formed.

Figure 4A:
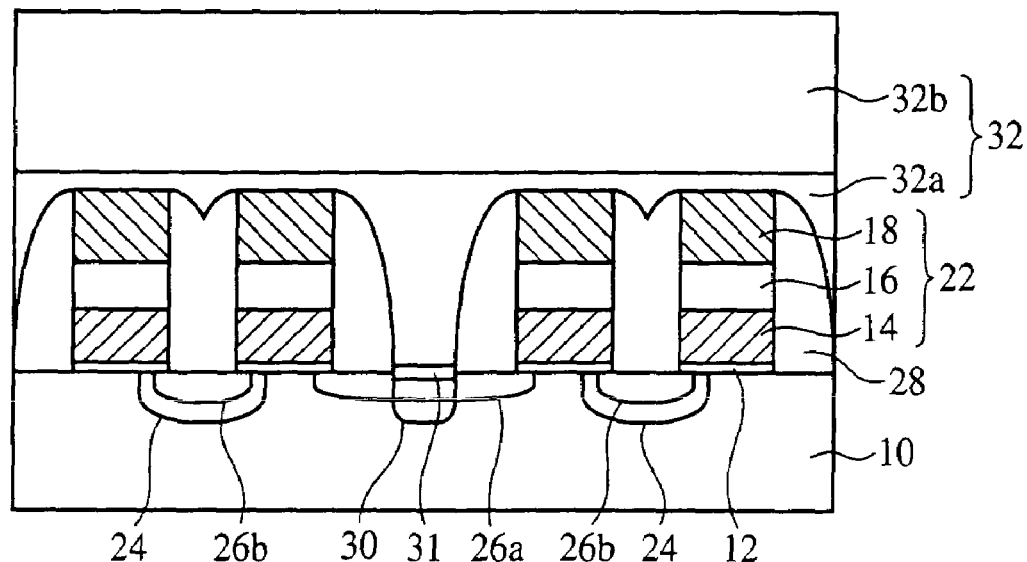
FIGS. 4A and 4B are sectional views of a semiconductor device according to a first embodiment of the present invention in the steps of the method for fabricating the semiconductor device, which show the method (Part 4).

Next, as shown in FIG. 4A, the surface of the inter-layer insulation film 32 is polished by, e.g., CMP (Chemical Mechanical Polishing).

Figure 4B:
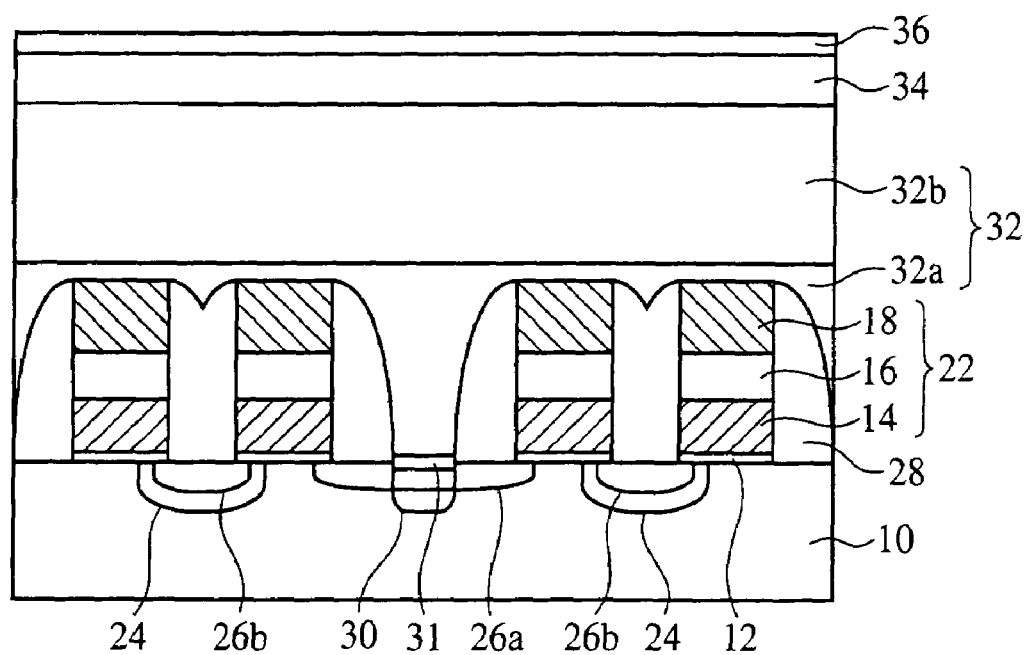

Then, as shown in FIG. 4B, a cap film 34 of $SiO_2$ is formed on the entire surface by, e.g., plasma enhanced CVD.

Next, a reflection preventing film 36 of SiON is formed on the entire surface by, e.g., plasma enhanced CVD.

Figure 5A:
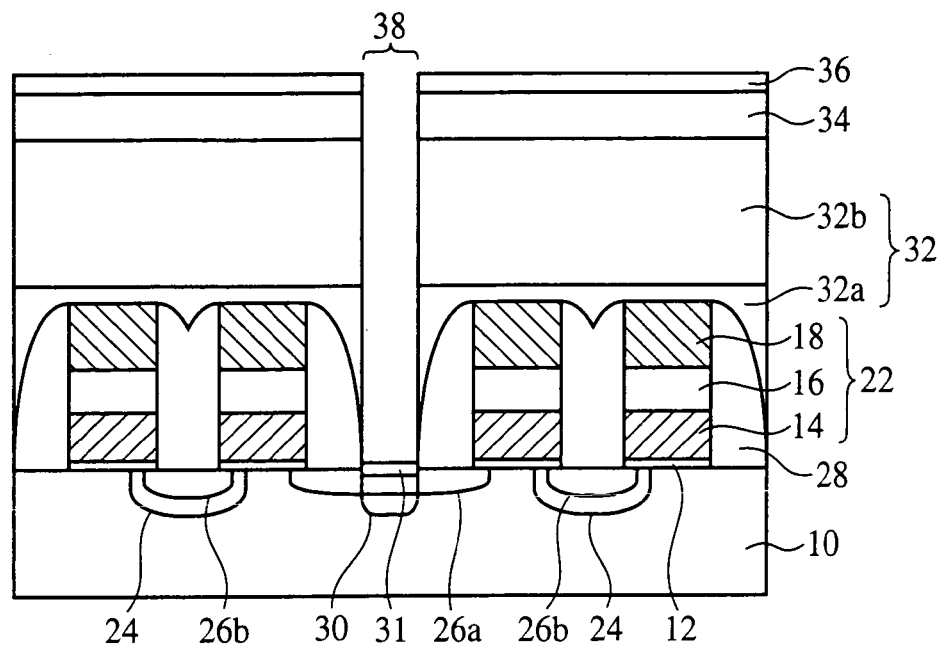
FIGS. 5A and 5B are sectional views of a semiconductor device according to a first embodiment of the present invention in the steps of the method for fabricating the semiconductor device, which show the method (Part 5).

Next, as shown n FIG. 5A, a contact hole 38 is formed in the reflection preventing film 36, the cap film 34 and the inter-layer insulation film 32 down to the contact layer 30 by photolithography.

Figure 5B:
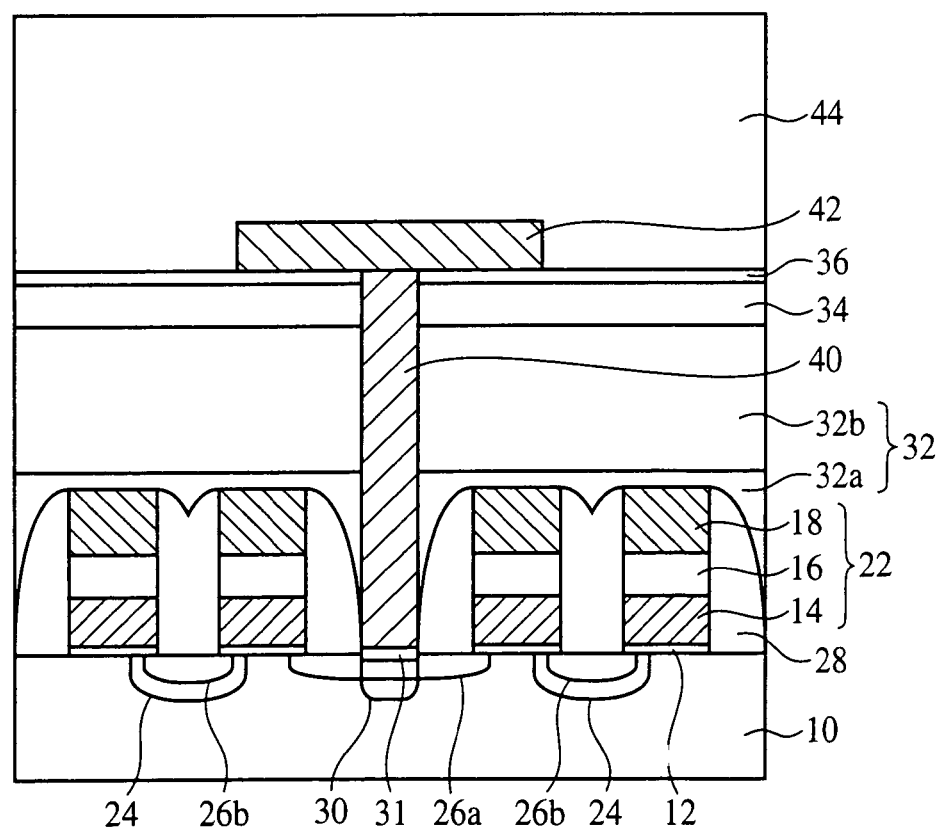

Then, as shown in FIG. 5B, a conductor plug 40 of W (tungsten) is buried in the contact hole 38.

Next, an inter-connection layer 42 is formed of Al (aluminium) on the reflection preventing film 36 and the conductor plug 40.

Next, an inter-layer insulation film 44 is formed of $SiO_2$ on the entire surface by, e.g., plasma enhanced CVD.

Thus, the semiconductor device is fabricated by the present embodiment.

The method for fabricating the semiconductor device according to the present embodiment is characterized mainly in that the inter-layer insulation film 32a is deposited with a first pressure of the inside of the deposition chamber 102, which is a little lower than the atmospheric pressure, then the pressure in the deposition chamber 102 is gradually decreased to a second pressure which is relatively lower, and then the inter-layer insulation film 32b is further deposited with a second pressure of the inside of the deposition chamber 102, which is set at a second pressure.

In the proposed method for fabricating the semiconductor device, as described above, the inter-layer insulation film is deposited with a first pressure of the inside of the deposition chamber, which is a little lower than the atmospheric pressure, the atmosphere in the deposition chamber is exhausted to set the pressure inside the deposition chamber to be a second pressure, and with the second pressure of the inside of the deposition chamber the inter-layer insulation film is further deposited. In the proposed method for fabricating the semiconductor device, as described above, when the pressure inside the deposition chamber is set at the second pressure, the pressure inside deposition chamber is extremely decreased, and additionally, the atmosphere inside deposition chamber becomes unstable. Resultantly, the inter-layer insulation film is deposited in disuniform thickness; in the proposed method for fabricating the semiconductor device, a film thickness distribution of the inter-layer insulation film in the intra-plane of the semiconductor wafer is larger on one side of the semiconductor wafer and smaller on the other side of the semiconductor wafer. When the surface of the inter-layer insulation film having such film thickness distributions polished by CMP, the difference between a maximum value and a minimum value of the film thickness of the inter-layer insulation film is further increased. Thus, the proposed method for fabricating the semiconductor device cannot provide an inter-layer insulation film with a sufficiently flat surface.

On the other hand, in the present embodiment, when the first pressure inside the deposition chamber 102 is decreased to the second pressure, the pressure inside the deposition chamber 102 is gradually decreased to thereby prevent the pressure inside the deposition chamber 102 from being extremely decreased to make the atmosphere inside deposition chamber 102 unstable. Thus, according to the present embodiment, the inter-layer insulation film of highly uniform film thickness can be formed. Furthermore, according to the present embodiment, the intra-plane distribution of the inter-layer insulation film is concentric. Therefore, according to the present embodiment, increase of the film thickness disuniformity of the inter-layer insulation film can be suppressed when the surface of the inter-layer insulation film is polished by CMP. Accordingly, the present embodiment can provide an inter-layer insulation film with a sufficiently flat surface.

(Evaluation Result)

Next, the evaluation result of the method for fabricating the semiconductor device according to the present embodiment will be explained with reference to FIG. 8.

Figure 8:
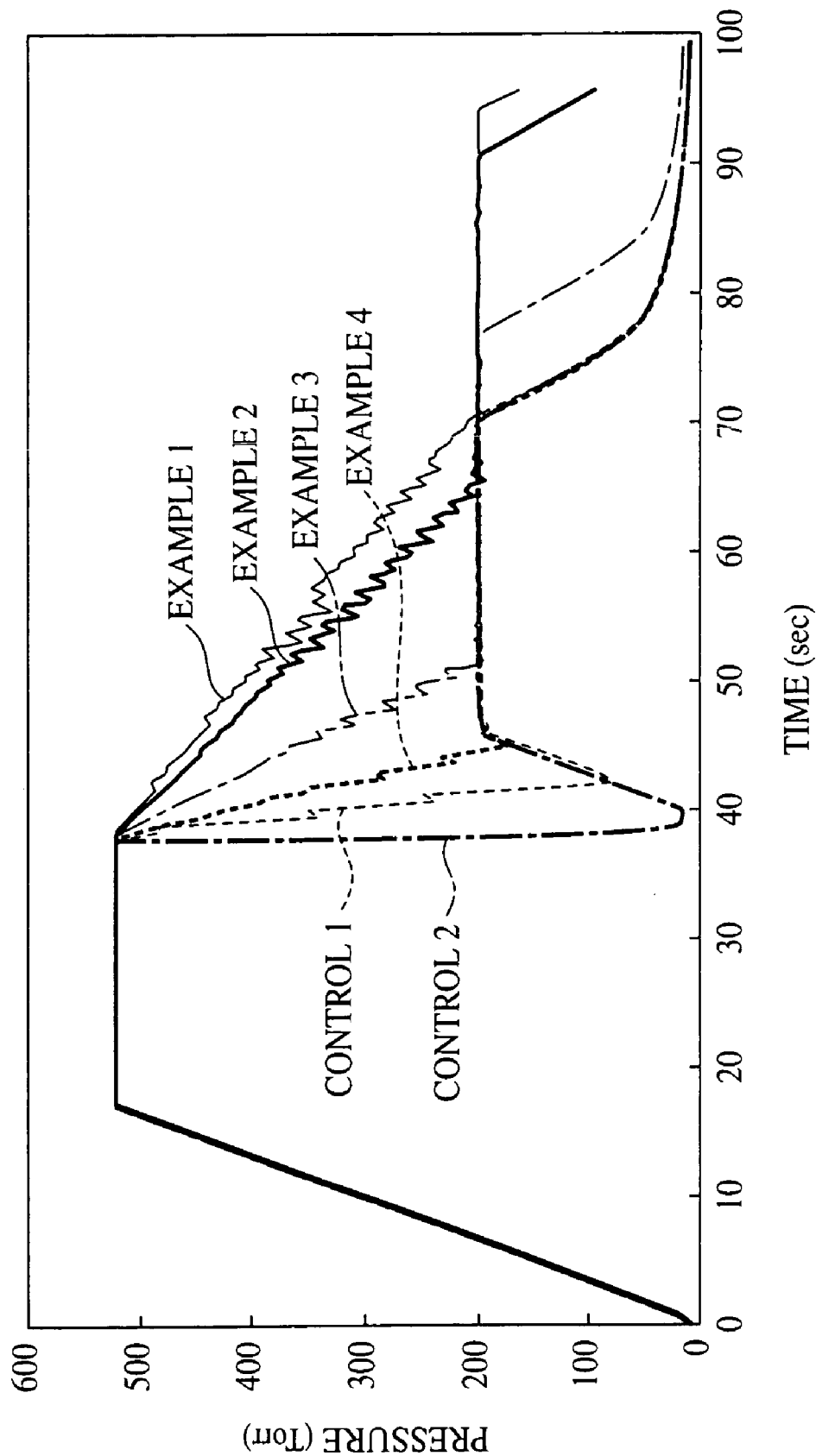
FIG. 8 is a time chart of measurement results of pressures in the deposition chamber.

FIG. 8 is the time chart of the measurement results of pressures in the deposition chamber when the inter-layer insulation films are formed by the method for fabricating the semiconductor device according to the present embodiment. The film deposition apparatus 102 was a sub-atmospheric CVD apparatus.

Example 1 and Example 2 show cases that in changing the first pressure in the deposition chamber 102 to the second pressure, pressures in the deposition chamber 102 were gradually decreased at the rate of 10 Torr/sec. In Example 1, the pressure in the deposition chamber 102 was decreased at 8 steps. In Example 2, the pressure in the deposition chamber 102 was continuously decreased.

In Example 3, in changing the first pressure in the deposition chamber 102 to the second pressure, the pressure in the deposition chamber was gradually decreased at the rate of 20 Torr/sec. Example 3, the pressure in the deposition chamber 102 was continuously decreased.

In Example 4, the pressure in the deposition chamber 102 was gradually decreased at the rate of 40 Torr/sec in changing the first pressure in the deposition chamber 102 to the second pressure. In Example 4, the pressure in the deposition chamber 102 was continuously decreased.

In Control 1, in changing the first pressure in the deposition chamber 102 to the second pressure, the pressure in the deposition chamber 102 was gradually decreased at the rate of 80 Torr/sec. In Control 1, the pressure in the deposition chamber 102 was continuously decreased.

Control 2 shows a case of the proposed method for fabricating the semiconductor device, i.e., the pressure in the deposition chamber 102 was set at the second pressure while the atmosphere in the deposition chamber 102 was being exhausted.

As seen in FIG. 8, in Controls 1 and 2, the pressure in the deposition chamber 102 is extremely decreased in the process of setting the pressure in the deposition chamber 102 at the second pressure.

In Examples 1 to 4, the extreme decrease of the pressure in the deposition chamber 102 in the process of setting the pressure in the deposition chamber 102 at the second pressure is prevented.

Based on the above, the present embodiment can prevent the extreme decrease of the pressure in the deposition chamber 102 to resultantly to make an atmosphere in the deposition chamber unstable in the process of changing the pressure in the deposition chamber 102 to set at the second pressure.

Figure 9:
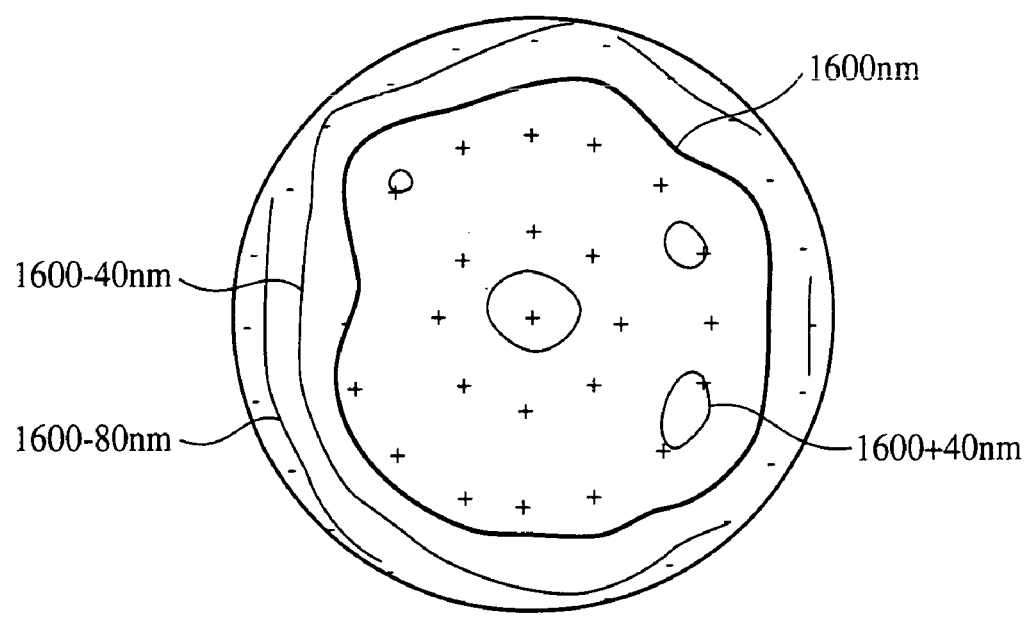
FIG. 9 is a plan view of an intra-plane distribution of film thicknesses of the inter-layer insulation film (Part 1).

FIG. 9 is a plan view of the intra-plane distribution of the film thickness of the inter-layer insulation film which is formed by the method for fabricating the semiconductor device according to the present embodiment. FIG. 9 is the upper side view of the semiconductor wafer. In FIG. 9, the film thickness are indicated by contours. In FIG. 9, the thick line indicates the part where the film thickness is 1600 nm. In the drawing, the "+" marks indicate the part where the film thickness of the inter-layer insulation film is larger than 1600 nm. In the drawing, the "−" marks indicate the part where the film thickness of the inter-layer insulation film is smaller than 1600 nm.

As seen in FIG. 9, in the present embodiment, the intra-plane distribution of the film thickness of the inter-layer insulation film is concentric. In the present embodiment, the concentric intra-plane of the film thickness of the inter-layer insulation film 32 can prevent increase of the difference between a maximum value and a minimum value of the film thickness of the inter-layer insulation film 32 when the surface of the inter-layer insulation film 32 is polished by CMP.

Figure 10:
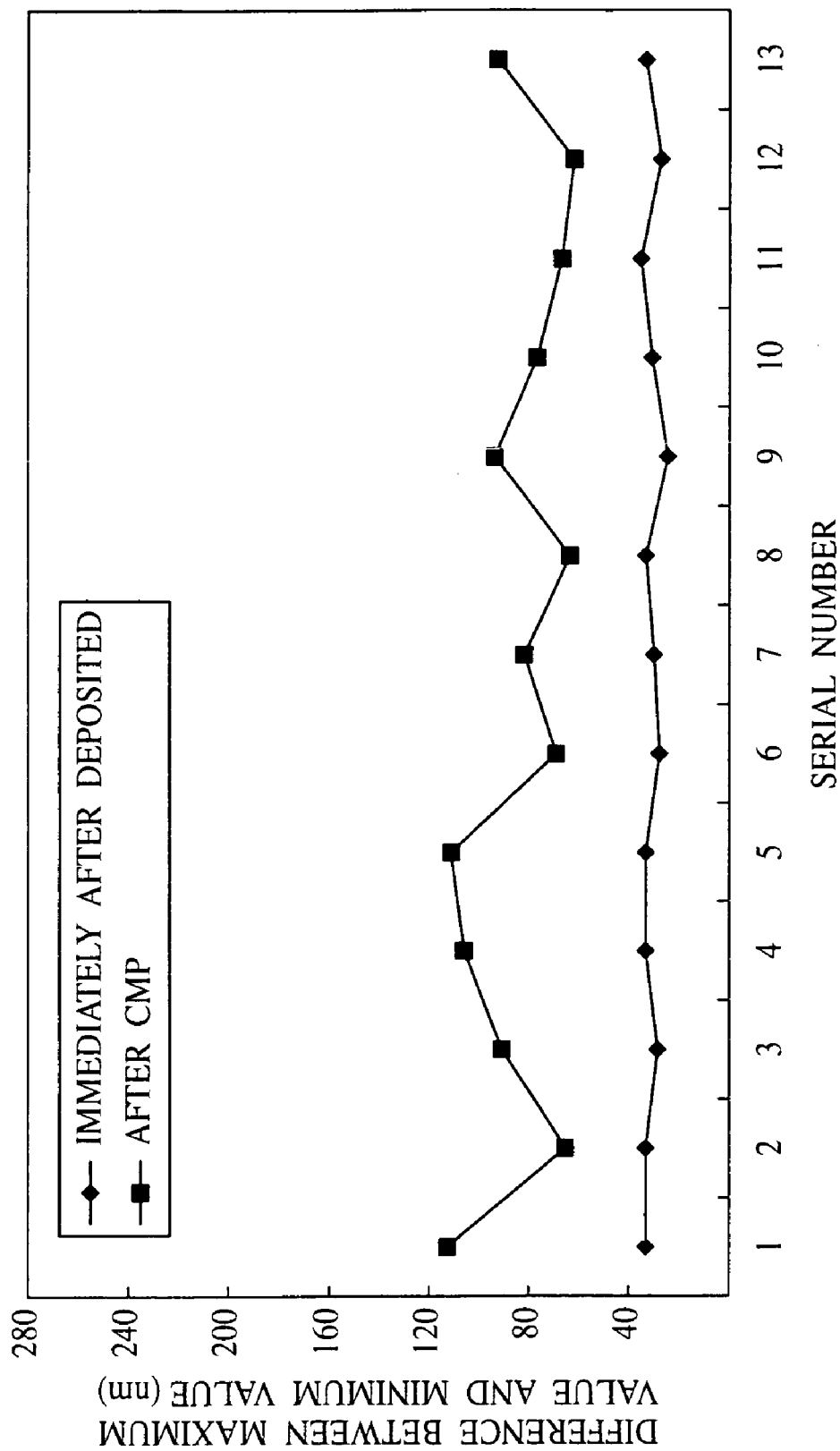
FIG. 10 is a graph of differences between maximum values and minimum values of film thicknesses of the inter-layer insulation films (Part 1).

FIG. 10 is a graph of differences between maximum values and minimum values of the film thickness of the inter-layer insulation film when the inter-layer insulation film is formed by the method for fabricating the semiconductor device according to the present embodiment. Serial numbers of the semiconductor wafers are taken on the horizontal axis. Differences of the maximum values and the minimum values are taken on the vertical axis. The "♦" marks indicate differences between the maximum values and the minimum values of the inter-layer insulation films immediately after formed. The "■" marks indicate differences between the maximum values and the minimum values of the inter-layer insulation films after having the surfaces polished by CMP.

As seen in FIG. 10, in the method for fabricating the semiconductor device according to the present embodiment, the difference between the maximum value and the minimum value of the film thickness of the inter-layer insulation film 32 immediately after formed is depressed smaller in comparison with that in the proposed method for fabricating the semiconductor device (see FIG. 14).

In the method for fabricating the semiconductor device according to the present embodiment, the differences between the maximum values and the minimum values of the film thickness of the inter-layer insulation film 32 after having the surface of the inter-layer insulation film 32 polished by CMP are depressed smaller than those in the proposed method for fabricating the semiconductor device (see FIG. 14).

Based on the above, it can be seen that the method for fabricating the semiconductor device according to the present embodiment can fabricate a semiconductor device having the inter-layer insulation film with a sufficiently flat surface.

[A Second Embodiment]

Figure 11:
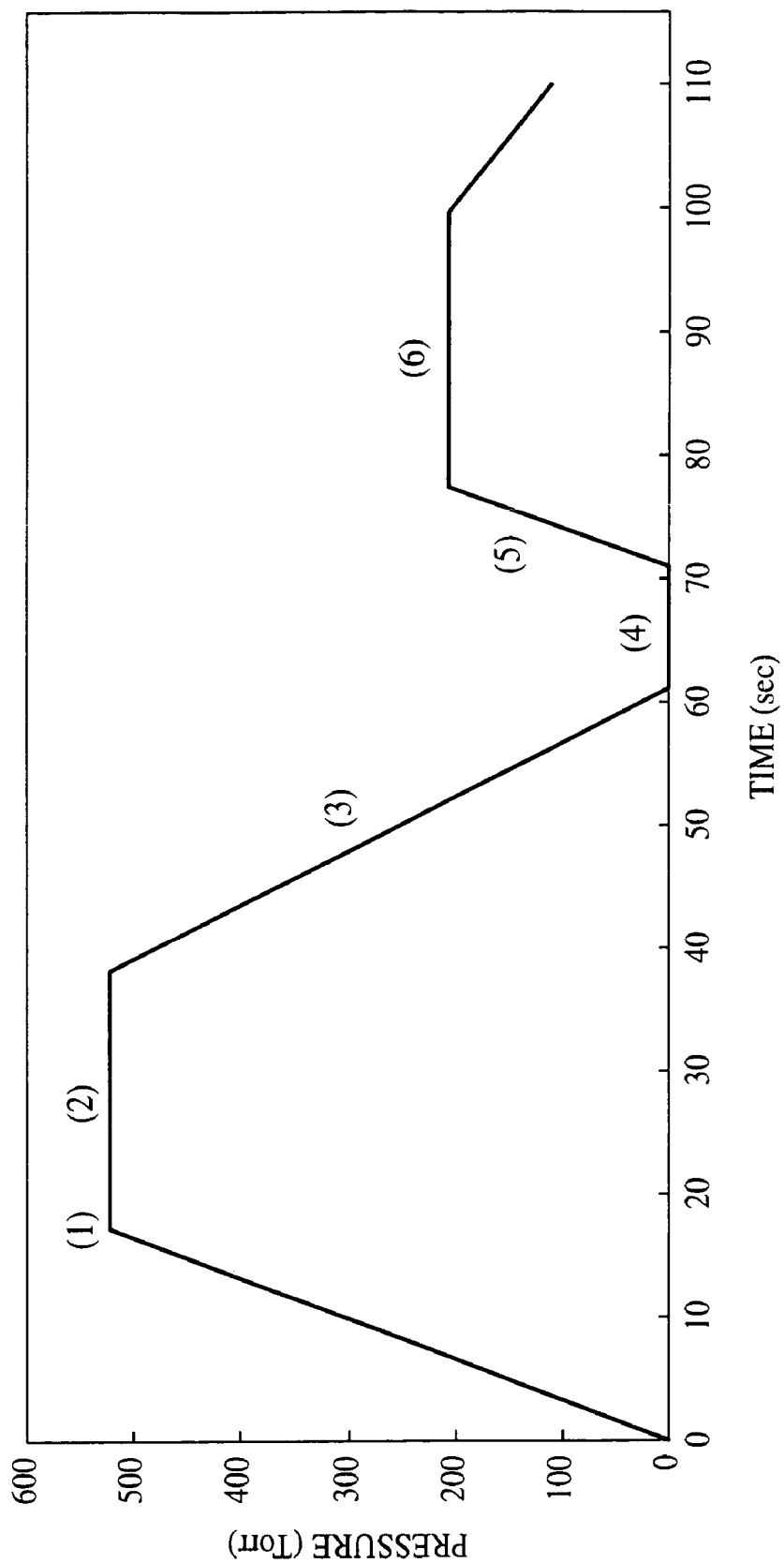
FIG. 11 is a time chart of pressures in the deposition chamber (Part 2).

The method for fabricating the semiconductor device according to a second embodiment of the present invention will be explained with reference to FIG. 11. FIG. 11 is the time chart of pressures in the deposition chamber when the inter-layer insulation film is formed by the method for fabricating the semiconductor device according to the present embodiment. The same members of the present embodiment as those of the method for fabricating the semiconductor device according to the first embodiment shown in FIGS. 1A to 10 are represented by the same reference numbers not to repeat or to simplify their explanation.

The method for fabricating the semiconductor device according to the present embodiment is characterized mainly in that the inter-layer insulation film is deposited with the pressure in the deposition chamber set at a first pressure, then substituting an atmosphere in the deposition chamber with an inert gas atmosphere, exhausting the atmosphere in the deposition chamber so as to gradually decrease the pressure in the deposition chamber, and then the inter-layer insulation film is further deposited with the pressure in the deposition chamber set at a second pressure.

First, as indicated by (1) in FIG. 11, the pressure in the deposition chamber 102 (see FIG. 6) is set data first pressure which is a little lower than the atmospheric pressure. The first pressure is, e.g., about 600 Torr.

Then, as indicated by (2) in FIG. 11, with the pressure in the deposition chamber 102 set at the first pressure, a raw material gas is introduced into the deposition chamber 102 to deposit the inter-layer insulation film 32a (see FIG. 3B). Film deposition conditions for this are the same as those in the method for fabricating the semiconductor device according to the first embodiment.

Next, the introduction of the raw material gas into the deposition chamber 102 is stopped.

As indicated by (3) in FIG. 11, an inert gas is introduced into the deposition chamber 102 to replace an atmosphere in the deposition chamber with the inert gas atmosphere to exhaust the atmosphere in the deposition chamber 102 so as to gradually decrease the pressure in the deposition chamber 102. The pressure in the deposition chamber 102 is gradually decreased while the inert gas is introduced into the deposition chamber so that the atmosphere in the deposition chamber is completely replaced by an inert gas atmosphere by the time when the pressure in the deposition chamber becomes lower than the second pressure. The inert gas can be, e.g., He gas, $N_2$ gas or $O_2$ gas. When the pressure in the deposition chamber 102 is gradually decreased, in the same way as described above, the opening of the throttle valve 116 is controlled while the pressure in the deposition chamber 102 is metered by a pressure gauge 104, whereby the pressure in the deposition chamber 102 is decreased. The rate of lowering the pressure in the deposition chamber 102 is, e.g., smaller than 40 Torr/sec., preferably 5–40 Torr/sec.

Then, as indicated by (4) in FIG. 11, the introduction of the inert gas into the deposition chamber 102 is stopped, and almost all of the atmosphere in the deposition chamber is exhausted. The period of time for the exhaust is, e.g., 5–20 seconds.

Then, as indicated by (5) in FIG. 11, an inert gas is introduced into the deposition chamber 102 to increase the pressure in the deposition chamber 102 to the second pressure. The inert gas is, e.g., He gas, $N_2$ gas or $O_2$ gas. As described above, the second pressure is, e.g., about 200 Torr. The inert gas is introduced without introducing the raw material gas when the pressure in the deposition chamber is increased to the second pressure, whereby the inter-layer insulation film can be prevented from depositing in disuniform thickness.

Then, as indicated by (6) in FIG. 11, with the pressure in the deposition chamber 102 set at the second pressure, the raw material gas is introduced into the deposition chamber 102, whereby the inter-layer insulation film 32b is further deposited (see FIG. 3B).

Thus, the inter-layer insulation film 32 (see FIG. 3B) is formed.

As described above, it is possible that the inter-layer insulation film can be deposited with the pressure in the deposition chamber set at the first pressure, then the atmosphere in the deposition chamber is replaced by an inert gas atmosphere to exhaust the atmosphere in the deposition chamber so as to gradually decrease the pressure in the deposition chamber, and then, the inter-layer insulation film may be further deposited with the pressure in the deposition chamber set at the second pressure. The atmosphere in the deposition chamber is replaced by an inert gas atmosphere to gradually decrease the pressure in the deposition chamber, whereby when the pressure in the deposition chamber is lower than the second pressure, the atmosphere in the deposition chamber has been already replaced by the inert gas atmosphere. Accordingly, the present embodiment can also prevent the deposition of the inter-layer insulation film in a state that the pressure in the deposition chamber is extremely low, and the atmosphere in the deposition chamber is unstable. When the pressure in the deposition chamber is increased to the second pressure, a raw material gas is not introduced, but an inert gas is introduced, whereby the inter-layer insulation film is prevented from deposition in disuniform thickness. Thus, the present embodiment as well as the method for fabricating the semiconductor device according to the first embodiment can prevent the inter-layer insulation film from depositing in disuniform thickness. Accordingly, the present embodiment as well as the method for fabricating the semiconductor device according to the first embodiment can depress disuniformity of the film thickness of the inter-layer insulation film when the surface of the inter-layer insulation film is polished by CMP. Accordingly, the present embodiment can fabricate a semiconductor device having the inter-layer insulation film with a sufficiently flat surface.

[A Third Embodiment]

Figure 12:
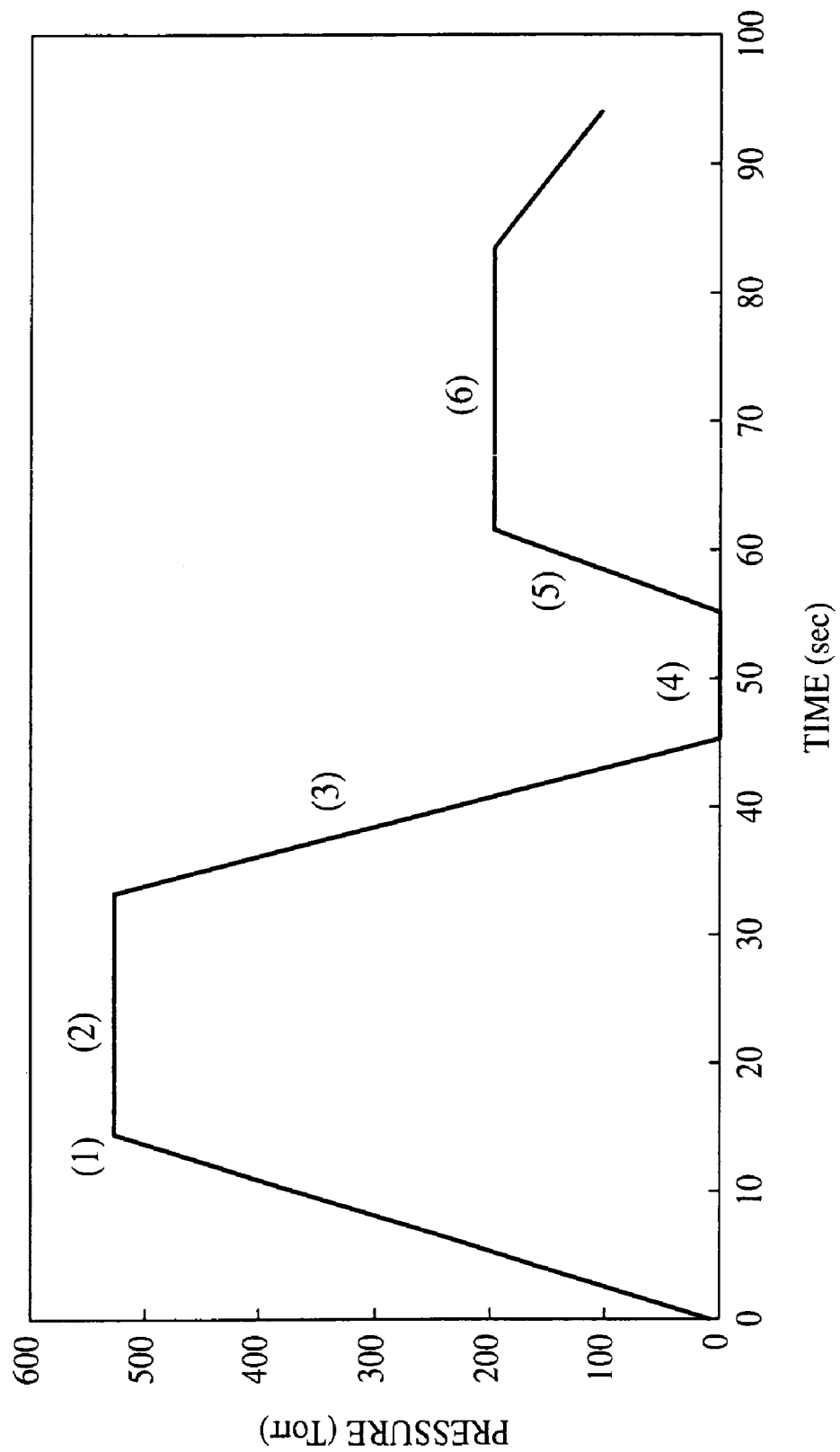
FIG. 12 is a time chart of pressures in the deposition chamber (Part 3).

The method for fabricating the semiconductor device according to a third embodiment of the present invention will be explained with reference to FIG. 12. FIG. 12 is the time chart of the pressure in the deposition chamber when the inter-layer insulation film is formed by the method for fabricating the semiconductor device according to the present embodiment. The same members of the present embodiment as those of the method for fabricating the semiconductor device according to the first or the second embodiment are represented by the same reference numbers not to repeat or to simplify their explanation.

The method for fabricating the semiconductor device according to the present embodiment is characterized mainly in that the inter-layer insulation film 32a is formed with the pressure in the deposition chamber 102 set at a first pressure, then an atmosphere in the deposition chamber 102 is replaced by an inert atmosphere to exhaust the atmosphere in the deposition chamber 102, and then the inter-layer insulation film 32b is further deposited with the pressure in the deposition chamber 102 set at the second pressure.

First, as indicated by (1) in FIG. 12, the pressure in the deposition chamber 102 (see FIG. 6) is set at a first pressure which is a little lower than the atmospheric pressure. The first pressure is, e.g., about 600 Torr.

Then, as indicated by (2) in FIG. 12, a raw material gas is introduced into the deposition chamber 102 with the pressure in the deposition chamber 102 set at the first pressure to deposit the inter-layer insulation film 32 (see FIG. 3B). Film deposition conditions of this are the same as those for the method for fabricating the semiconductor device according to the first embodiment.

Then, the introduction of a raw material gas into the deposition chamber 102 is stopped.

Then, an inert gas is introduced into the deposition chamber 102 to replace the atmosphere in the deposition chamber 102 by the inert gas atmosphere. The inert gas is, e.g., He gas, $N_2$ gas or $O_2$ gas. The atmosphere in the deposition chamber 102 is replaced by an inert gas atmosphere so as to prevent the extreme decrease of the pressure in the deposition chamber 102, and the depositon of the inter-layer insulation film in the unstable state of the inside of the deposition chamber 102, whereby the inter-layer insulation film is prevented from deposition in disuniform thickness.

Then, as indicated by (3) in FIG. 12, the atmosphere in the deposition chamber 102 is exhausted. The exhaust period of time is, e.g., about 5–20 seconds.

Then, as indicated by (4) in FIG. 12, the introduction of the inert gas into the deposition chamber is stopped. Almost all of the atmosphere in the deposition chamber is exhausted. The period of time for this is, e.g., about 5–20 seconds.

Next, as indicated by (5) in FIG. 12, the inert gas is introduced to increase the pressure in the deposition chamber to the second pressure. As described above, the inert gas is, e.g., He gas, $N_2$ gas or $O_2$ gas. As described above, the second pressure is, e.g., about 200 Torr. The raw material gas is not introduced, but the inert gas is introduced when the pressure in the deposition chamber 102 is increased to the second pressure, whereby, as in the method for fabricating the semiconductor device according to the second embodiment, the inter-layer insulation film is prevented from being formed in disuniform thickness.

Then, with the pressure in the deposition chamber 102 set at the second pressure as indicated by (6) in FIG. 12, the inter-layer insulation film 32b (see FIG. 3B) is further deposited. Film deposition conditions for this are the same as those in the method for fabricating the semiconductor device according to the first embodiment.

Thus, the inter-layer insulation film 32 (see FIG. 3B) is formed.

As described above, it is possible that after the inter-layer insulation film 32a is deposited with the pressure in the deposition chamber 102 set at the first pressure, then an atmosphere in the deposition chamber 102 is replaced by an inert atmosphere, the atmosphere in the deposition chamber 102 is exhausted, and then the inter-layer insulation film is further deposited with the pressure in the deposition chamber 102 set at the second pressure. When the atmosphere in the deposition chamber 102 is exhausted, the atmosphere in the deposition chamber 102 has been already replaced by an inert gas atmosphere, which can prevent the inter-layer insulation film 32 from being formed in disuniform thickness. When the pressure in the deposition chamber 102 is increased to the second pressure, a raw material gas is not introduced, but an inert gas is introduced, which can prevent the inter-layer insulation film 102 from being formed in disuniform thickness. Thus, the present embodiment can prevent the inter-layer insulation film 32 from being formed in disuniform thickness, as can the method for fabricating the semiconductor device according to the first and the second embodiments. Accordingly, the present embodiment can suppress the increase of disuniform film thickness of the inter-layer insulation film 32 when the surface of the inter-layer insulation film 32 is polished by CMP, as can the method for fabricating the semiconductor device according to the first and the second embodiments. Thus, the present embodiment can fabricate a semiconductor device having the inter-layer insulation film with a sufficiently flat surface.

[Modifications]

The present invention is not limited to the above-described embodiments and can cover other various modifications.

For example, in the method for fabricating the semiconductor device according to the first embodiment, the pressure in the deposition chamber is gradually decreased from the first pressure to the second pressure while the atmosphere in the deposition chamber is being replaced by an inert atmosphere. However, it is possible that with a raw material gas introduced into the deposition chamber, the pressure in the deposition chamber is gradually decreased from the first pressure to the second pressure.

In the above-described embodiments, the inter-layer insulation film of BPSG is formed, but the inter-layer insulation film is not essentially formed of BPSG film and may be formed of BSG (Boron-Silicate Glass) film, PSG (Phospho-Silicate Glass) film, USG (Un-doped Silicate Glass) film or others, or other materials.

In the third embodiment, the atmosphere in the deposition chamber is exhausted after the atmosphere in the deposition chamber has been replaced by an inert atmosphere. However, the atmosphere in the deposition chamber may be exhausted while the atmosphere in the deposition chamber is being replaced by an inert atmosphere. Even in the case that the atmosphere in the deposition chamber is exhausted, replacing the atmosphere in the deposition chamber by an inert atmosphere, the atmosphere in the deposition chamber can be substituted by the inert atmosphere by the time when the pressure in the deposition chamber becomes lower than the second pressure, whereby the extreme decrease of the pressure in the deposition chamber and the deposition of the inter-layer insulation film in the unstable atmospheric state in the deposition chamber can be prevented.

In the above-described embodiments, the first pressure is 600 Torr, but the first pressure is not essentially 600 Torr. The first pressure is suitably set so that the inter-layer insulation film can be buries between the gate electrodes, etc. The first pressure can be 400–600 Torr.

In the above-described embodiments, the second pressure is 200 Torr, but the second pressure is not limited to 200 Torr. The second pressure can be, e.g., 200–400 Torr.

In the above-described embodiments, the inter-layer insulation film is formed on the semiconductor substrate with the gate electrode formed on. However, what are present on the semiconductor substrate when the inter-layer insulation film is formed are not limited to the gate electrode. The present invention is applicable to a case where the inter-layer insulation film is formed on the semiconductor substrate, e.g., with interconnection layers, etc. formed on. That is, the present invention is widely applicable to cases that the inter-layer insulation film is formed on substrates with concavities and convexities formed in the surfaces by patterning, etc.

In the above-described embodiments, semiconductor devices are fabricated. However, the present invention is not limited to fabricating semiconductor devices and is widely applicable to fabricating all other devices.

In the above-described embodiments, the inter-layer insulation film is formed. However, the present invention is not limited to depositing the inter-layer insulation film and is widely applicable to cases where insulation films are formed. That is, the present invention is widely applicable to cases where insulation films are formed on substrates with concavities and convexities formed in the surfaces by patterning, etc.

In the above-described embodiments, semiconductor devices are fabricated. However, the present invention is not limited to fabricating semiconductor devices and is widely applicable to depositing insulation films.

What is claimed is:

1. A method for fabricating a semiconductor device comprising:
   the step of depositing an insulation film with a first pressure set in a deposition chamber;
   the pressure adjusting step of decreasing a pressure gradually in the deposition chamber from a first pressure to a second pressure which is lower than the first pressure; and
   the step of further depositing the insulation film with the second pressure set in the deposition chamber;
   wherein in the pressure adjusting step, the pressure in the deposition chamber is gradually decreased from the first pressure to the second pressure without introduction of a raw material gas of the insulation film into the deposition chamber.

2. A method for fabricating a semiconductor device according to claim 1, wherein
   in the pressure adjusting step, a pressure in the deposition chamber is gradually decreased from the first pressure to the second pressure while an atmosphere in the deposition chamber is being replaced by an inert atmosphere.

3. A method for fabricating a semiconductor device according to claim 1, wherein
   in the pressure adjusting step, a pressure in the deposition chamber is gradually decreased at a rate smaller than 40 Torr/sec.

4. A method for fabricating a semiconductor device according to claim 3, wherein
   in the pressure adjusting step, a pressure in the deposition chamber is gradually decreased at a 5–40 Torr/sec.

5. A method for fabricating a semiconductor device according to claim 1, which further comprises,
   before the step of depositing the insulation film, the step of forming a gate electrode of a transistor on a semiconductor substrate; and in which in the step of depositing the insulation film, the insulation film is deposited so as to cover the gate electrode.

6. A method for fabricating a semiconductor device according to claim 1, which further comprises,
before the step of depositing the insulation film, the step of forming an interconnection layer above the semiconductor substrate; and
in which in the step of depositing the insulation film, the insulation film is deposited so as to cover the interconnection layer.

7. A method for fabricating a semiconductor device according to claim 1, wherein
the first pressure is 400–600 Torr; and
the second pressure is 200–400 Torr.

8. A method for fabricating a semiconductor device according to claim 1, wherein
in the step of depositing the insulation film, the insulation film is deposited by thermal chemical vapor deposition.

9. A method for fabricating a semiconductor device according to claim 1, wherein
the insulation film is a BPSG film, a BSG film, a PSG film or an USG film.

10. A method for fabricating a semiconductor device according to claim 1, further comprising,
after the step of further depositing the insulation film, the step of polishing the surface of the insulation film.

11. A method for fabricating a semiconductor device comprising:
the step of depositing an insulation film with a first pressure set in a deposition chamber;
the pressure adjusting step of decreasing a pressure gradually in the deposition chamber from a first pressure to a second pressure which is lower than the first pressure; and
the step of further depositing the insulation film with the second pressure set in the deposition chamber;
wherein in the pressure adjusting step, a pressure in the deposition chamber is gradually decreased at a rate smaller than 40 Torr/sec.

* * * * *